(12) United States Patent
Pinai et al.

(10) Patent No.: US 6,445,233 B1
(45) Date of Patent: Sep. 3, 2002

(54) MULTIPLE TIME CONSTANT RECTIFIER APPARATUS AND METHOD

(75) Inventors: Hoang Minh Pinai, San Jose; Clyde "Kip" M. Brown, Cupertino; Anthony J. Becker, San Jose, all of CA (US)

(73) Assignee: The Engineering Consortium, Inc., Santa Clara, CA (US)

( * ) Notice: Subject to any disclaimer, the term of this patent is extended or adjusted under 35 U.S.C. 154(b) by 0 days.

(21) Appl. No.: 09/475,802

(22) Filed: Dec. 30, 1999

(51) Int. Cl.$^7$ ................................................ H03L 7/06
(52) U.S. Cl. ........................................ 327/159; 327/134
(58) Field of Search .............................. 327/93, 94, 95, 327/330, 331, 332, 343, 344, 345, 531, 157, 159, 131, 132, 133, 134, 137, 148, 150

(56) References Cited

U.S. PATENT DOCUMENTS

| | | | | |
|---|---|---|---|---|
| 3,778,725 A | * | 12/1973 | Spaargaren et al. ............ 327/93 |
| 4,151,469 A | | 4/1979 | Frutiger ..................... 325/38 R |
| 4,170,720 A | | 10/1979 | Killion .................... 179/107 R |
| 4,689,819 A | | 8/1987 | Killion ........................ 381/68 |
| 4,718,099 A | | 1/1988 | Hotvet ....................... 381/68.4 |
| 4,823,392 A | | 4/1989 | Walker ....................... 381/106 |
| 4,882,761 A | | 11/1989 | Waldhauer ................... 381/106 |
| 4,882,762 A | | 11/1989 | Waldhauer ................... 381/106 |
| 4,934,770 A | | 6/1990 | Anderson et al. ............ 330/278 |
| 4,996,712 A | | 2/1991 | Laurence et al. ........... 381/68.4 |
| 5,128,566 A | | 7/1992 | Killion et al. .............. 307/567 |
| 5,144,156 A | * | 9/1992 | Kawasaki .................... 327/157 |
| 5,144,675 A | | 9/1992 | Killion et al. ............. 381/68.4 |
| 5,272,394 A | | 12/1993 | Kirk et al. .................. 307/351 |
| 5,278,912 A | | 1/1994 | Waldhauer ................. 381/68.4 |
| 5,402,494 A | | 3/1995 | Flippe et al. ............... 381/69.2 |
| 5,402,498 A | | 3/1995 | Waller, Jr. ................... 381/106 |
| 5,508,660 A | * | 4/1996 | Gersbach et al. ............ 327/157 |
| 4,592,087 C1 | | 8/1996 | Killion ........................ 381/68 |
| 5,550,923 A | | 8/1996 | Hotvet ........................ 381/72 |
| 5,566,204 A | * | 10/1996 | Kardontchik et al. ....... 327/148 |
| 5,602,925 A | | 2/1997 | Killion ...................... 381/68.4 |
| 5,822,442 A | | 10/1998 | Agnew et al. .............. 381/107 |
| 5,825,239 A | * | 10/1998 | Adal .......................... 327/563 |
| 5,832,097 A | | 11/1998 | Armstrong et al. ........... 381/32 |
| 5,898,328 A | * | 4/1999 | Shoji .......................... 327/157 |
| 6,043,715 A | * | 3/2000 | Bailey et al. ................ 327/157 |
| 6,140,853 A | * | 10/2000 | Lo .............................. 327/157 |
| 6,147,530 A | * | 11/2000 | Nogawa ..................... 327/156 |
| 6,194,935 B1 | * | 2/2001 | Pioppo et al. .............. 327/170 |

* cited by examiner

Primary Examiner—Terry D. Cunningham
Assistant Examiner—Paul Dinh
(74) Attorney, Agent, or Firm—Jerry G. Wright; Coudert Brothers, LLP

(57) ABSTRACT

A rectifier circuit produces an output which is a function of the magnitude of an input signal and has a controllable transient response. The circuit requires no rectification diodes. The voltage on a capacitor is sensed and compared with that of an input voltage. The operation of charging and discharging switches is adjusted by a control circuit to charge the capacitor if the magnitude of the input signal is greater than the capacitor voltage and to discharge the capacitor if the magnitude of the input signal is less than the capacitor voltage. The attack and release function of the rectifier is selectable by limiting the rate at which current charges/discharges the capacitor, preferably with constant current sources comprised of current mirrors. Multiple time constants are achieved by replicating the storage capacitor and charge/discharge elements configured with different time constants and then summing the resultant capacitor voltages.

18 Claims, 10 Drawing Sheets

MULTIPLE TIME CONSTANT RECTIFIER APPARATUS AND METHOD

FIELD OF THE INVENTION

The present invention relates generally to low voltage CMOS rectifiers. More particularly, the present invention is directed towards a CMOS rectifier with controlled transient response for use in audio amplifier compression and automatic sound level control circuits.

BACKGROUND OF THE INVENTION

It is desirable in a variety of amplifier applications to have an automatic gain control element that adjusts the gain as a function of input signal level strength. An automatic gain control element may be used by itself or with additional compressor elements to reduce the gain as a function of input signal level strength.

The designers of audio systems describe an "attack" time required for an automatic gain control element to adjust the gain of an audio amplifier in response to a sudden increase in audio signal level and a "release" time for the gain to recover after the audio signal level decreases to a normal or average level. Typically, the attack time is defined as the time that it takes for an audio amplifier to stabilize to within about 1 dB of its final value after a sudden increase in input audio level. The release time is typically defined as the time that it takes for an audio amplifier to decrease to within about 1 dB of its final value after the input audio level has decreased to normal levels. Typically, it is desirable that an audio amplifier have a release time that is much longer than its attack time.

A short attack time is desirable to produce a comfortable reduction in sound level after an abrupt increase in sound level, e.g., the ringing of an alarm bell.

However, an abrupt return to ordinary gain levels when the audio signal level decreases to ordinary levels may sound unnatural to many users. Consequently, it is typically desirable that the release time be much longer than the attack time. As an illustrative example, a preferred attack time for an automatic gain control used in an audio compressor may be less than one millisecond whereas a preferred release time may be ten milliseconds.

More generally, the transient response of an automatic gain control element can also be described in terms of an attack function and a release function. Commonly, the attack and release function is in the form of an exponential response, since a variety of passive circuits comprised of resistors and capacitors may be used to implement an exponential response. For a simple exponential response, the exponential time constant describes the attack/release function.

An automatic gain control element may be used to perform several different functions. One function of an automatic gain control element is as an automatic sound level controller that maintains an average audio output level, or loudness, that is comfortable to the listener. This has the advantage that the user does not need to manually adjust the sound level to achieve a comfortable level of sound amplification as the background sound level varies. Another function of an automatic gain control element is to compress the gain at high input signal levels in order to avoid the generation of distortion which may otherwise occur at such signal levels. As is well-known in the field of amplifier design, amplifiers typically produce a distorted output when the input signal level exceeds a preferred level. For example, when the inputs to an amplifier become too large the output of a "linear" amplifier may become saturated at a constant power-output regardless of further increases in input signal level strength, resulting in non-linear (distorted) amplification. Still another function of an automatic gain control element is as a syllabic compressor. A syllabic compressor automatically compresses sound as a function of amplitude according to a function that is designed to improve the ability of the listener to understand certain sounds, such as distinguishing between consonant and syllabic sounds.

Although a variety of compressors are known in the amplifier art, compressors suitable for miniature hearing aids pose special problems. First, there are severe space limitations in miniature hearing aids. Hearing aid designers are forced by space constraints to severely limit the number of discrete capacitors and resistors in the total hearing aid circuit, since discrete components greatly exacerbate the problems of fitting all of the hearing aid components into a unit sized to fit partially or totally in the ear canal. Thus, an audio compressor for use in a miniature hearing aid should utilize a minimum number of discrete capacitors and resistors. Second, there are severe power supply limitations. Miniature hearing aids are powered by a single miniature hearing aid battery with a nominal voltage of less than 1.5 volts. Consequently, an audio compressor circuit for use in a hearing aid should be consistent with low voltage operation. Third, cost is an important consideration for the low-cost hearing aid market. A hearing aid integrated circuit, including one or more compressors, should be compact in order to reduce the per-unit cost.

Hearing aids are one of the most common examples of miniature audio devices in which it is desirable to incorporate automatic gain control elements, typically as audio compressors. However, a wide variety of other miniature audio devices, such as cellular phones and micro-recorders, may also beneficially use automatic gain control elements as syllabic compressors, gain compressors, or as a sound level controllers to improve the sound quality of transmitted or recorded speech. There is a general need for a miniature control circuit that may be used in combination with a voltage-controlled amplifier as part of a compressor with selectable attack/rise characteristics.

Conventional audio compressors used in hearing aids commonly utilize signal characterization elements requiring at least two discrete capacitors and one discrete resistor to implement an attack/release function in a compressor. For example, U.S. Pat. No. 4,718,099 discloses a voltage controlled compression amplifier with controlled attack and release time constants designed for use as a compressor in a hearing aid. As shown in the prior art block circuit diagram of FIG. 1, a voltage controlled amplifier 10 has an output 12 that may be fed into other amplifier elements 26, 28 that are suitably coupled by connections 27, 29 to a hearing aid receiver. The gain of voltage controlled amplifier 10 is further regulated by a gain control terminal 13 coupled 15 to a gain control voltage source 14. Gain control voltage source 14 includes a Shotcky diode (not shown in FIG. 1) to produce a rectified current 16 when the output 12 exceeds a predetermined threshold level. The rectified current 16 of gain control voltage source 14 is coupled to node 24 of a signal characterizer 20. The function of signal characterizer 20 is to convert an input signal 16 into a form suitable for regulating the voltage at gain control terminal 13, i.e., to decrease the gain of amplifier 10 with an appropriate attack time in response to an abrupt increase in amplifier output 12 and to restore the gain of amplifier 10 with an appropriate release time when the amplifier output 12 decreases to normal levels. Signal characterizer 20 comprises a first capacitor 21 in parallel with a series connection of resistor 23 and second capacitor 22. The signal characterizer 20 has a short attack time corresponding to the equivalent RC turn on time of first capacitor 24 and a a slow release time corresponding to the equivalent RC turn-off time of a second capacitor 22 and its associated resistor 23.

One drawback of the automatic gain control circuit of U.S. Pat. No. 4,718,099 is that signal characterizer 20 requires comparatively large discrete resistors and discrete capacitors in order to achieve RC time constants of capacitors 21, 22 consistent with attack and release times on the order of microseconds. For example, in a preferred embodiment of U.S. Pat. No. 4,718,099, a first time constant means comprises a 0.47 microfarad capacitor and a second time constant means comprises a second capacitor with a capacitance of 2.2 microfarads and a resistor with a resistance of 220 kilo-ohms. As is well known in the art of CMOS design, it is impractical to fabricate capacitors with extremely large capacitance values in an integrated circuit. Consequently, the preferred embodiment of U.S. Pat. No. 4,718,099 requires two external capacitors for its implementation. This is highly undesirable for a miniature hearing aid, since it is difficult in modem miniature hearing aids to incorporate two external capacitors into the compact geometry of in-the-ear and in-the-canal hearing aids. Moreover, while large value resistors (e.g., greater than 100 kilo-ohms) may be implemented in modern CMOS processes, large value resistors typically consume a large amount of chip area and are subject to lot-to-lot fabrication variations. Thus, U.S. Pat. No. 4,718,099 may also require a large value external resistor for its implementation in a high yield fabrication process, further increasing the difficulty of manufacturing a miniature hearing aid incorporating signal characterizer 20.

Another drawback of the automatic gain control circuit of U.S. Pat. No. 4,718,099 is that the attack/release function is limited to having simple exponential rise/fall characteristics. The signal characterization function that capacitors 21, 22 and other resistors may perform is intrinsically limited by well known mathematically relationships describing an exponential rise/decay of the voltage of capacitors 21, 22 in response to abrupt changes in control signal 16. While a compression function based upon a simple exponential rise/fall transient response may be desirable for some audio background environments, it is known in the art of hearing aid design that a simple exponential response does not produce an acceptable response for all hearing aid users in all audio environments. In particular, many hearing aids are returned because the compression circuits produce a so-called "pumping" effect in which the compression function strongly depends upon the background noise levels. Capacitors 21, 22 of signal characterizer 20 receive a rectified current from Shotcky diode (not shown) when the output is above a threshold signal level. In a noisy background environment, particularly one punctuated by repetitive or frequent loud noises (e.g., traffic noises on a busy street), capacitors 21, 22 will be charged up by the background noises. Consequently, the compression response of capacitors 21, 22 to a single audio pulse in a quiet room will be fundamentally different than that which occurs in a noisy background environment, particularly an environment punctuated by periods of repetitive high noise levels (e.g., the sound of traffic noises on a busy street). In some environments, the background noises will "pump" the compression up and down in a manner that results in the gain of desired sounds rising and falling in an unpleasant and unnatural sounding manner. For example, a noisy background environment may result in pumping that causes the sound of normal speech to fade in and out in an unpleasant manner.

A general problem in a variety of miniature audio devices is that it is difficult to implement a signal characterization circuit that provides a voltage to a voltage controlled amplifier with a controlled attack and release time. This problem is particularly acute in the context of miniature hearing aids because of the voltage and space constraints.

What is desired is a new design for a control element that provides a rectified control voltage with a selectable transient response function.

SUMMARY OF THE INVENTION

The present invention is a rectifier that provides an output that is a function of the magnitude of the input signal but with a selectable attack/release response. The present invention generally comprises: a capacitor; a charging current element coupled to the capacitor having a charging switch to regulate the flow of a charging current into the capacitor; a discharge current element coupled to said capacitor having a discharge switch to regulate the flow of a discharging current out of the capacitor; a switch controller with outputs for alternately turning on the charging switch and the discharge switch, the switch controller having a first signal input and a second input corresponding to the voltage on the capacitor; electrical connections for coupling the outputs of said switch controller to the switches; and electrical connections for coupling the capacitor voltage and an input signal to the switch controller; wherein the charging switch provides control signals to said switches when the magnitude of the input signal is greater than the capacitor voltage and the discharge switch is turned on when the magnitude of the input signal is less than the capacitor voltage.

In a preferred embodiment, the charging current elements and discharging current element comprise switched constant current sources. The switched constant current sources are preferably current mirrors with charging/discharging switches arranged to turn on/off the mirror currents of the current mirrors.

One object of the present invention is a rectifier that is extremely sensitive to very small voltage changes, such as voltage changes of about 250 millivolts.

Another object of the present invention is a low-voltage rectifier requiring a reduced number of discrete capacitors and resistors for its implementation.

Still another object of the present invention is a rectifier with a selectable transient response. In the preferred embodiment, the rectifier output voltage increases/decreases linearly with time in response to abrupt changes in input signal level magnitude.

Yet still another object of the present invention is the ability to sum the outputs of a plurality of rectifiers together to permit the transient response to be further adjusted.

DETAILED DESCRIPTION OF THE INVENTION

The present invention generally comprises a switched charging state rectifier that operates on the principle of comparing an input voltage to the voltage on a capacitor and making a logical decision to charge the capacitor if the magnitude of the input voltage is less than that of the capacitor and to discharge the capacitor if the voltage on the capacitor is greater in magnitude than that of the input signal. The rate at which current charges/discharges the capacitor is preferably limited by controlled constant current sources, although other non-constant current limiting elements (e.g., resistors) may also be used.

One of the intended uses of the switched charging state rectifier is to provide a control voltage to a voltage controlled amplifier with the benefit of a selectable attack/release function. As used in this application, an attack function refers to the characteristic rise response of the switched charging state rectifier in response to an abrupt increase in the magnitude of an input signal whereas a release function refers to the characteristic decay response of the switched charging state rectifier in response to an abrupt decrease in the magnitude of the input signal. Since, the transient response is not necessarily exponential, the attack/release function may be described mathematically or in regards to the shape of a curve plotting the transient response of switched charging state rectifier.

Figure 1:
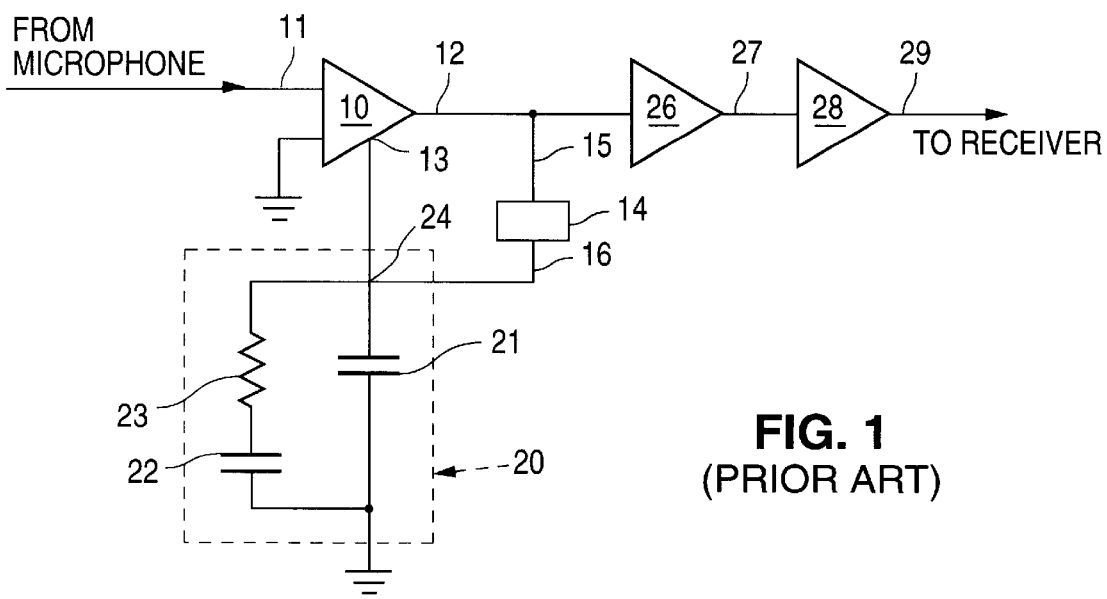
FIG. 1 is a block circuit diagram of a prior art voltage controlled audio amplifier utilizing a passive circuit with a first capacitor to control the attack time and a second capacitor to control the release time.
Figure 2A:
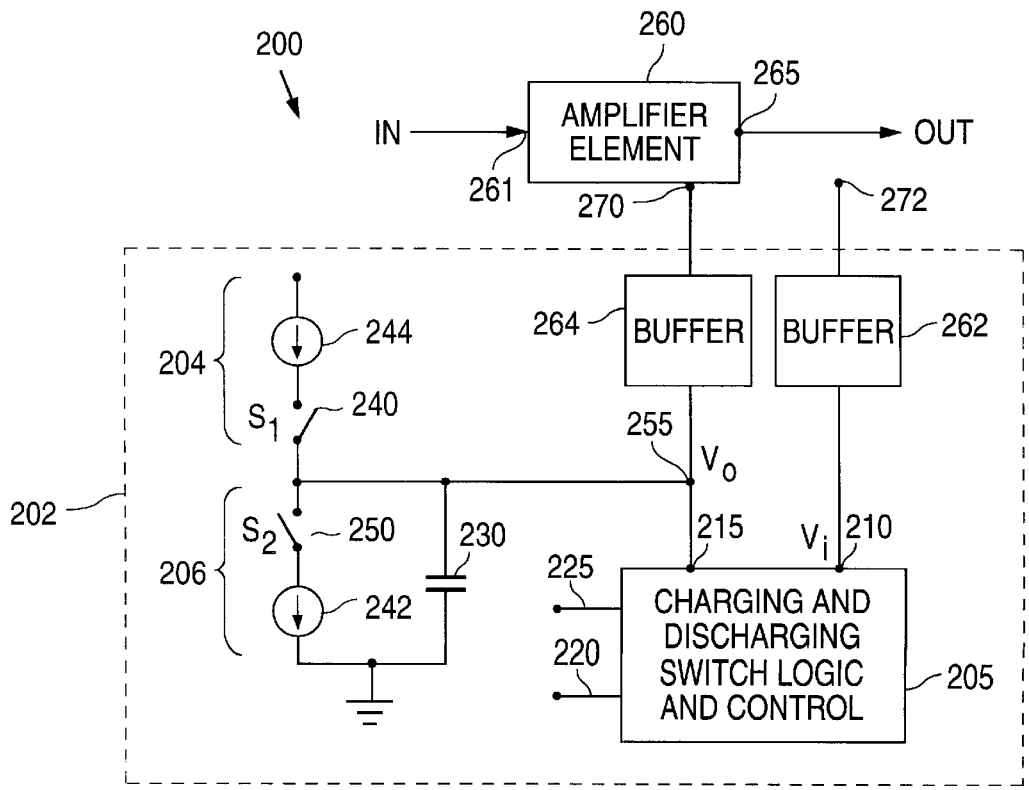
FIG. 2A is an illustrative block circuit diagram of a first embodiment of a switched charging state rectifier in which a control circuit is utilized to actively switch a capacitor between charging and discharging states to control the attack time and release time of an amplifier element.

FIG. 2A is an illustrative block circuit diagram illustrating some of the key aspects of the present invention. A switched charging state rectifier 202 provides an output voltage 270 that is a function of the magnitude of an input voltage 272. The output 270 may be used to control the function of a voltage controlled amplifier 260. The input terminal 272 of switched charging state rectifier 202 may be coupled in any common control configuration used to regulate an amplifier, such as coupling input terminal 272 to the input 261 of amplifier 260 in accord with an audio compressor configuration. A preferred voltage controlled amplifier element 260 is described in the patent application, "Audio Compression Circuit and Method," filed Dec. 30, 1999, Ser. No. 09/475,802, assigned to the assignee of the present invention, which is being filed on the same day as the present application. The teachings of the "Audio Compression Circuit," application, are hereby incorporated by reference. The input 272 and output 270 of switched charging state rectifier 202 are preferably coupled by isolation buffers 262, 264. Isolation buffers 262, 264 may comprise op-amp buffer circuits.

Switched charging state rectifier 202 has two primary modes of operation. In a first charging mode, the voltage on capacitor 230 is increased by a charging current. In a second discharging mode, the voltage on capacitor 230 is decreased by a discharge current. As indicated in FIG. 2A, the charging and discharging currents are preferably limited by current limiting elements comprised of constant current sources 244, 242. Switch 240 and constant current source 244 comprise a charging current element 204 that permits charging current to be turned on and off. Switch 250 and current source 242 comprise a discharge current element 206 that permits a discharging current to be turned on and off. It will be recognized by those of ordinary skill in the art that switches 240, 250 could also be connected in parallel with the their respective current sources 242, 244 to perform substantially the same function. It will also be understood that while constant current sources 244, 242 are a preferred means to limit the charging and discharging currents, other current limiting means may be used instead of constant current sources 244, 242.

Charging switch 240 and discharging switch 250 are alternately opened and closed by switch control logic element 205 according to a logical comparison function based upon the magnitude of input voltage 210 and capacitor voltage 255. When the magnitude of the input 210 is greater than the capacitor voltage 255, charging switch 240 is closed and discharge switch 250 is opened resulting in a charging current increasing the voltage on capacitor 230. For the situation that the input voltage 210 has a magnitude less than the capacitor voltage 255, the switch positions alternate and charging switch 240 is opened whereas discharging switch 250 is closed, resulting in a discharge current decreasing the capacitor voltage 255. While in some cases it may be desirable for switched charging state rectifier 202 to emulate an ideal rectifier, in a variety of audio amplifier applications it is desirable that the rectified voltage 270 track changes in the magnitude of the input 272 according to a preselected transient response.

The change in voltage on a capacitor is given by the mathematical expression: $V=Q/C$, where V is the voltage on the capacitor, Q is the charge on the capacitor, and C is the capacitance. In differential form, this can be expressed as: $dV/dT=I/C$, where $dV/dT$ is the time rate of change of voltage on the capacitor and I is the current charging/discharging the capacitor. This can also be expressed in integral form as: $\Delta V=1/C \int I(t)dt$, where $I(t)$ is current entering (or leaving) the capacitor over a particular time interval. Thus, the rate at which the voltage on capacitor 230 adjusts to changes in the magnitude of the input signal can be controlled by selecting the capacitance of capacitor 230 and the magnitude of the current of charging current source 244 and discharging current source 242. If $I(t)$ is constant during a given time interval $\Delta T$, then $\Delta V=I\Delta T/C$, or $\Delta V/\Delta T=I/C$. If the current, I, has a small magnitude then a comparatively small capacitor may be utilized to achieve a desired charge/discharge rate.

Figure 2B:
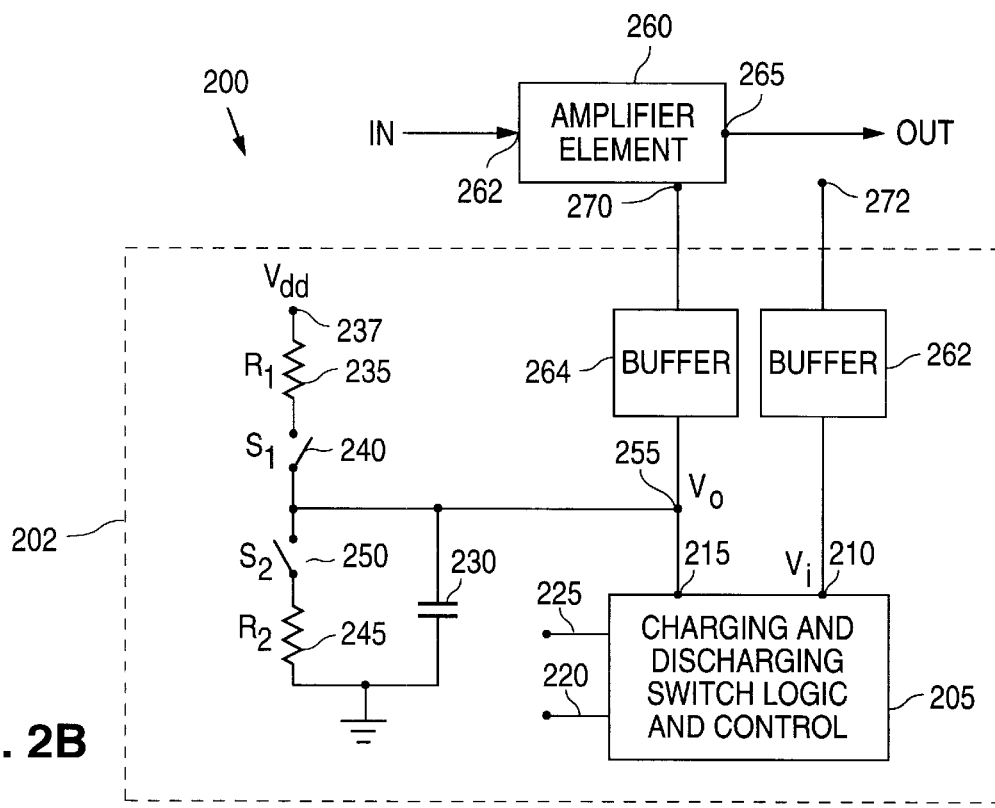
FIG. 2B is an illustrative block schematic circuit diagram of a second switched charging state rectifier.

A variety of current sources are known in the art of CMOS circuit design. In particular, a variety of so-called "current mirrors" are well known that permit the accurate control of very small currents. A conventional current mirror is shown in FIG. 2E. In a MOSFET current mirror, the gates of two MOSFETS are coupled together. The first MOSFET M1 is a diode-connected-transistor, i.e., its drain and gate are electrically connected. A reference bias current, $I_{D1}$, flowing through the source-drain terminals of diode-connected-transistor M1 determines the mirror current in the second MOSFET M2 because the bias voltage on the gate of transistor M2 is determined by the voltage coupled by diode-connected-transistor M1. The reference bias current $I_{D1}$, is supplied by another current source. The mirror current, $I_{D2}$ is a multiplicative factor of the reference bias current, $I_{D1}$, with the multiplicative factor depending upon the relative sizes (e.g., gate width) of transistors M1 and M2. Any conventional current mirror whose current output may be regulated using another switch may be used as part of a charging current element or discharging current element of the present invention. FIG. 2E shows a preferred embodiment of a switched current-mirror. A switch M3 has its source and drain terminals coupled to those of transistor M1. When switch M3 is turned on, it will shunt reference bias current $I_{D1}$ from transistor M1, which turns off the mirror current of transistor M2 (which is a multiplicative factor of the current flowing in transistor M1). Thus, a current mirror may be used to perform the function of a current source 244, 242 with switch M3 performing the function of a switch 240, 250 to turn on/off the mirror current. The selection of reference bias current $I_{D1}$ and the relative sizes of transistors M1 and M2 may be used to create a current source with a very small and accurately controlled current value. This permits the charging and discharging currents to be selected to achieve a wide range of charging/discharging rates of capacitor 230.

While the use of constant current sources 242, 244 comprised of current mirrors is preferred, more generally any circuit element that limits the charging/discharging current may be used with a switch to form charging current element 204 or discharge current element 206. These include current limiting components in which the current is not constant as a function of voltage. FIG. 2B shows another embodiment of switched charging state rectifier 202 utilizing current-limiting resistors 235, 245 to control the charging/discharging behavior. The charging current may be calculated by well-known relationships and depends upon the value of resistor 235 and the difference in voltage between voltage $V_{dd}$ at resistor terminal 237 and the voltage 255 on capacitor 230. The release time will be governed by the RC time constant of resistor 245 and capacitor 230, whereas the attack time will be governed by the RC time constant of resistor 235 and capacitor 230. The embodiment of FIG. 2B has the disadvantage that it is difficult to implement attack/release functions on the order of milliseconds without a large value capacitor 230 and large value resistors 235, 245. However, in some cases it may be desirable to have a switched charging state rectifier with a rectified voltage output that has exponential rise/decay characteristics. For example, hearing aid users each have their own particular hearing loss and lead different lifestyles such that they spend more of less of their time in noisy background environments. In some cases an output voltage with a conventional exponential rise/decay characteristics may be preferable to the linear rise/decay characteristics of the preferred embodiment of FIG. 2A.

Figure 2C:
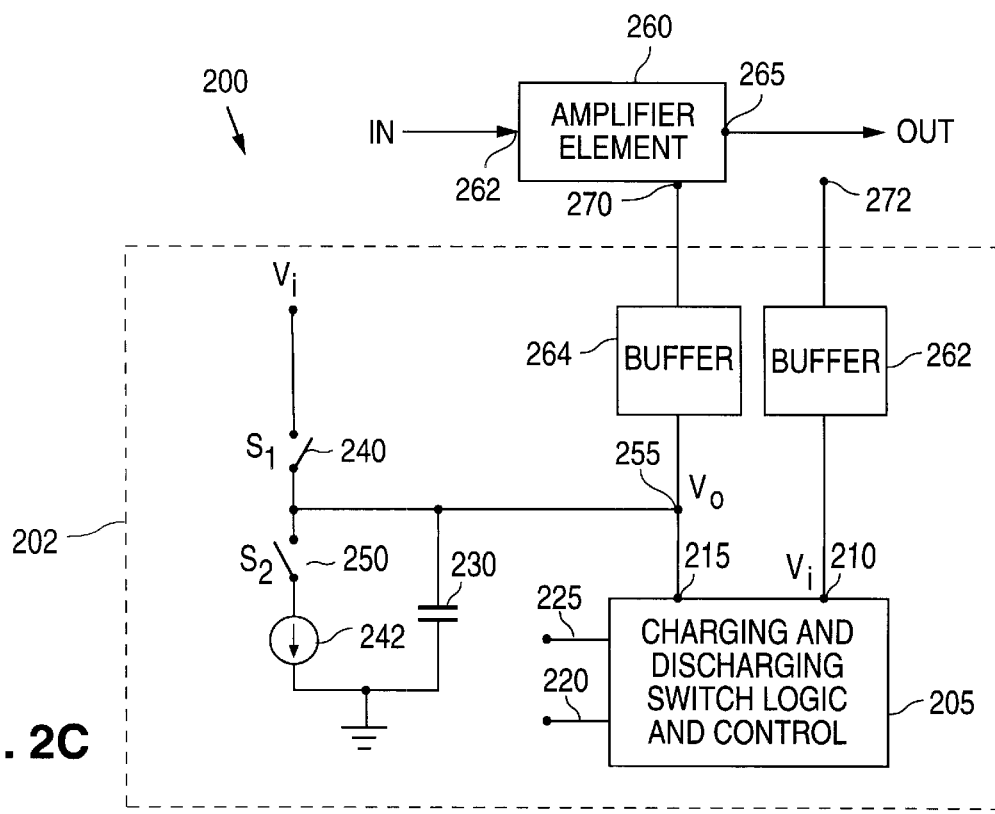
FIG. 2C is an illustrative block schematic circuit diagram of a third switched charging state rectifier.

FIG. 2C shows an alternate embodiment of a switched charging state rectifier for a low-cost hearing aid in which the switched charging state rectifier has a negligible attack time. In the embodiment of FIG. 2C, the discharging current is limited by a discharge current source 242. However, unlike previous embodiments, charging switch 240 couples the input voltage 210 to capacitor 230 whenever the value of input voltage 230 exceeds the voltage 255 of capacitor 230. This coupling is preferably done in a clocked manner so that the voltage rises on the capacitor 230 in short clocked timed intervals. The charging current will be limited primarily by an inherently short RC time constant of switch 240 and capacitor 230. This results in a low-cost switched charging state rectifier with an extremely short attack time but with a controlled release time. The output voltage will track increases in the magnitude of the input voltage but will respond to decreases in input voltage with a rate of voltage decrease determined by the capacitance and the discharge current.

Figure 2D:
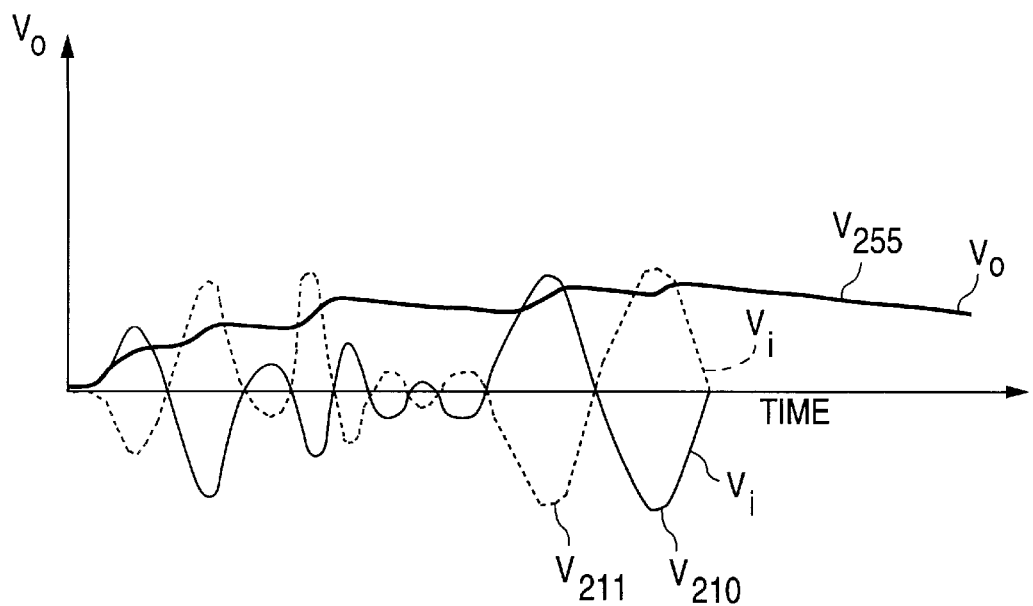
FIG. 2D is an illustrative plot of the output voltage of a switched charging state rectifier as a function of changes in magnitude of an input voltage showing a transient response that is a linear function of time.
Figure 2E:
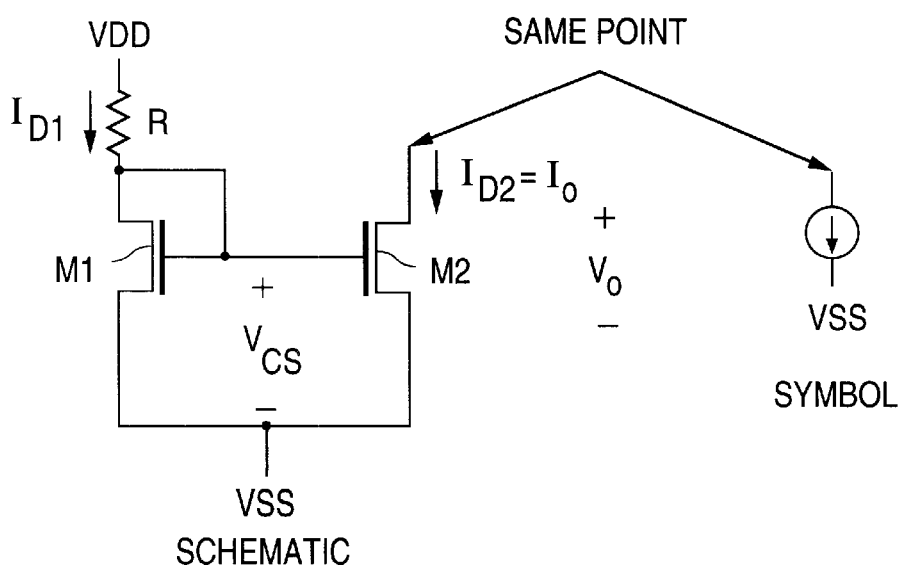
FIG. 2E is a prior art current mirror current source.
Figure 2F:
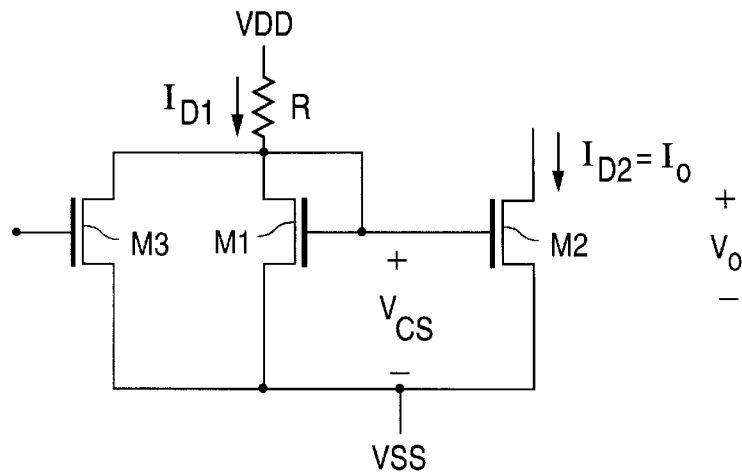
FIG. 2F is a schematic circuit diagram of a current mirror with an additional switch arranged to turn on and off the mirror current.

FIG. 2D is an illustrative plot of the voltage 255 across capacitor 230 for a time-varying input signal 210 for the preferred embodiment of FIG. 2A. A voltage inverted replica 211 of the input signal is also shown plotted in FIG. 2D. As can be seen in FIG. 2D, the voltage 255 on capacitor 230 will track changes in the magnitude of the input voltage according to different attack and release times. The capacitor voltage has linear rise/decay characteristics associated with the constant current charging source 244 and discharging current source 242. Although there is considerable debate as to the optimum attack/release characteristics for hearing aids, it is believed by the inventors that the linear rise/fall response shown in FIG. 2D may produce a more pleasant response in an audio compression circuit than for the embodiment of FIG. 2B, in which the voltage rises/falls according to an exponential relationship. Some sound environments, such as a room with a fan, have strong background noises. The linear attack/release function shown in FIG. 2D may eliminate the deleterious "pumping" effect associated with compressors in which the attack/release function varies with time according to an exponential relationship.

Figure 3:
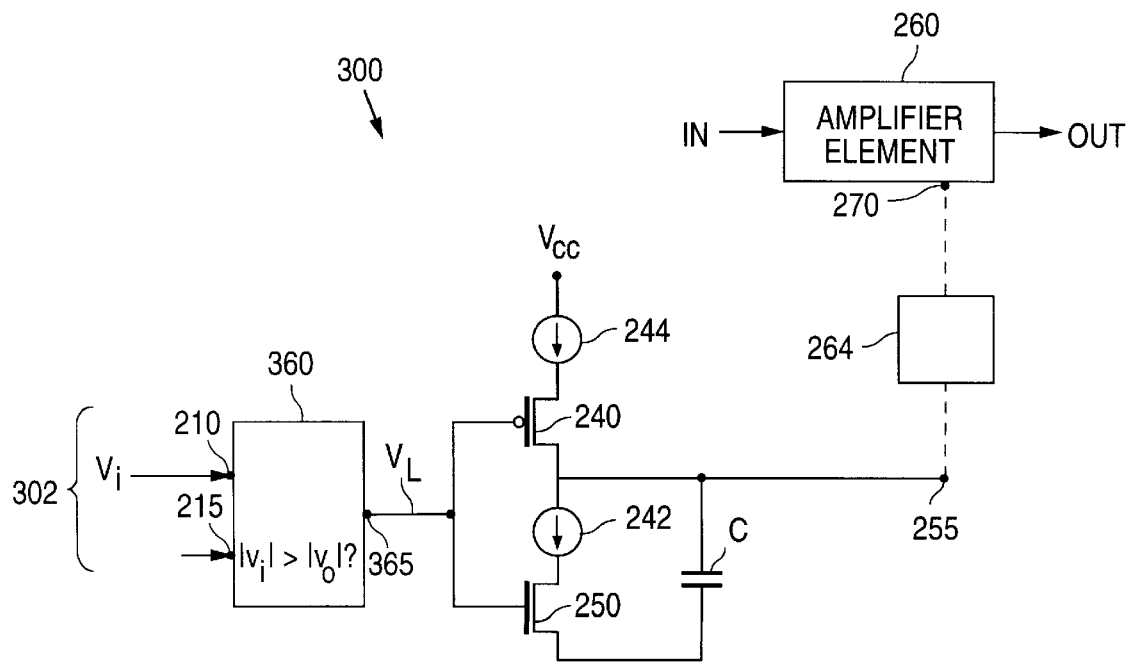
FIG. 3 is an illustrative block diagram showing an embodiment in which a single logical output is used to control two MOSFET switches configured as charging and discharging switches.

As shown in FIG. 3, a reduction in circuit complexity of switched charging state rectifier 302 is achieved by implementing charging switch 240 as a p-channel MOSFET and discharging switch 250 as a n-channel MOSFET in a complementary pair configuration driven by a single logic output 365 from a logic control element 360. Logic control element 360 receives as inputs the voltage 215 on capacitor 230 and an input signal 210. Logical output 365 corresponds to testing the truth of the logical condition that the magnitude of the input signal 210 is greater than the voltage 215 on capacitor 255.

Figure 4:
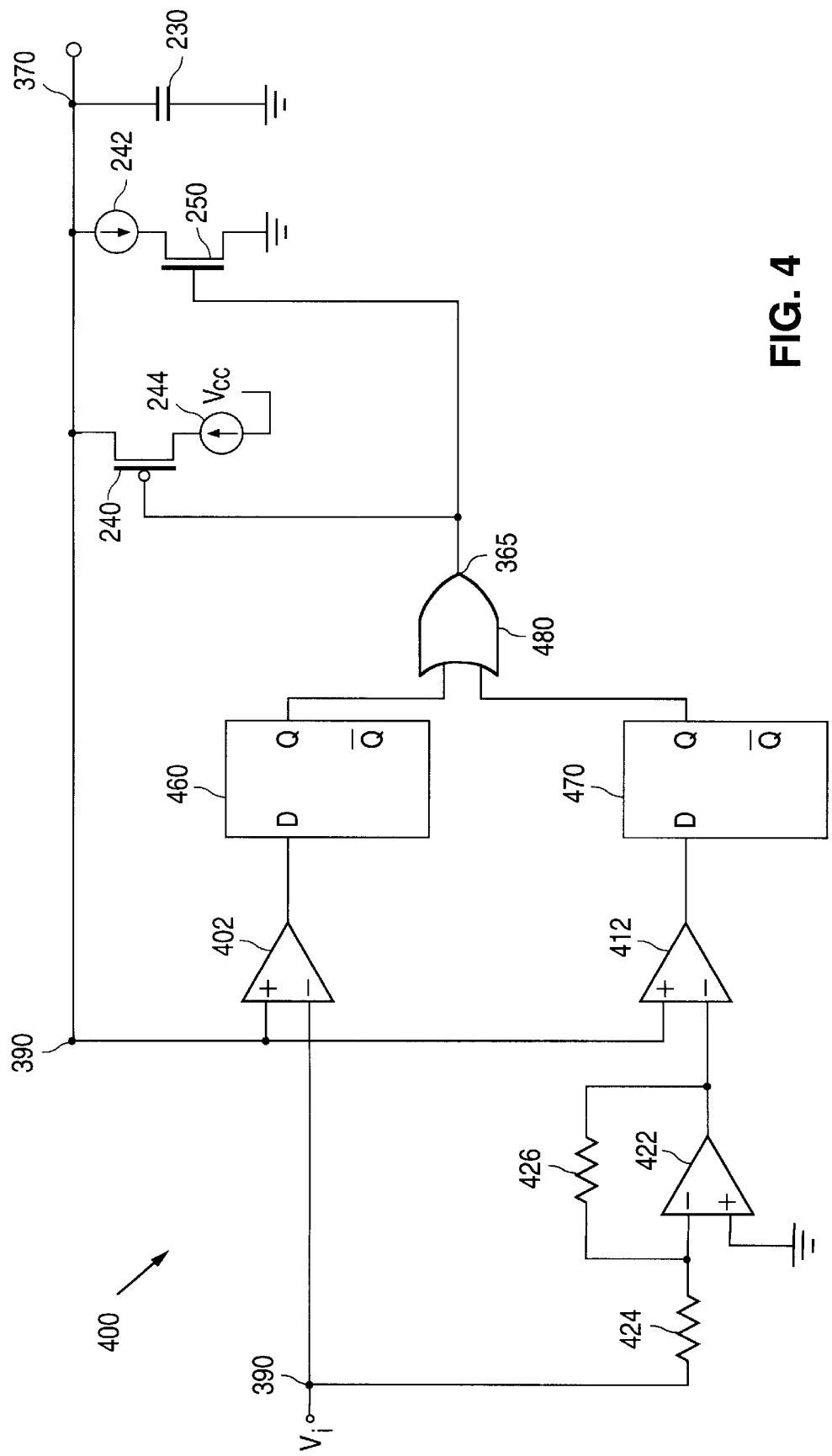
FIG. 4 is a block diagram showing a circuit schematic of a logical comparison circuit to implement the logical control function of FIG. 3.

FIG. 4 shows an embodiment of a switched charging state rectifier 400 with logic circuits to implement the logical control function of the control circuit 360 of FIG. 3. The function of switch controller 360 is implemented using two data flip flops 460, 470; two comparators 402, 412; a voltage inverter 422; and a logic gate 480 to combine the outputs of the data flip-flops 460, 470. First comparator 402 compares the input voltage 390 with the voltage 390 of capacitor 330. Consequently, first data flip-flop 460 will have its logical outputs toggle if the input voltage 390 increases to a level higher than that on capacitor 230. Unfortunately, no change in state of first data flip-flop 460 will occur when input voltage 390 has a negative value. Consequently, a second comparator 412 is required to achieve a full-wave comparison function. Second comparator 412 compares a voltage-inverted replica of input voltage 390 with the voltage 370 of capacitor 230. Consequently, second data flip-flop 470 toggles its logical outputs when the inverted (i.e., multiplied by negative one) input voltage increases to a level higher than that on capacitor 330. As indicated in FIG. 4, a preferred method to invert the input voltage 390 is to use an op-amp 422 with resistors 424, 426 configured as a voltage inverter. The operation of data flip-flops is well known and does not need to be described in detail. A data flip flop has a normal output, "Q" and also an output corresponding to the complement of Q. Generally, the logically outputs of data flip-flops 460, 470 may be used in a variety of ways to create a control signal to appropriately charge/discharge capacitor 230 using switches 240, 250. One way, as shown in FIG. 4, is to combine an output from each flip-flop 460, 470 into a logic gate 480 to produce a logical output 365 corresponding to the logical condition that the input voltage 390 is greater than the capacitor voltage 370. As shown in FIG. 4, an OR gate 480 is a simple logical gate to implement this relationship, since its output 365 will be high if either data flip-flop 460, 470 has a high output. However, more generally a variety of logical gates 480 may be used to implement the same function in accord with well known Boolean logical relationships.

Figure 5:
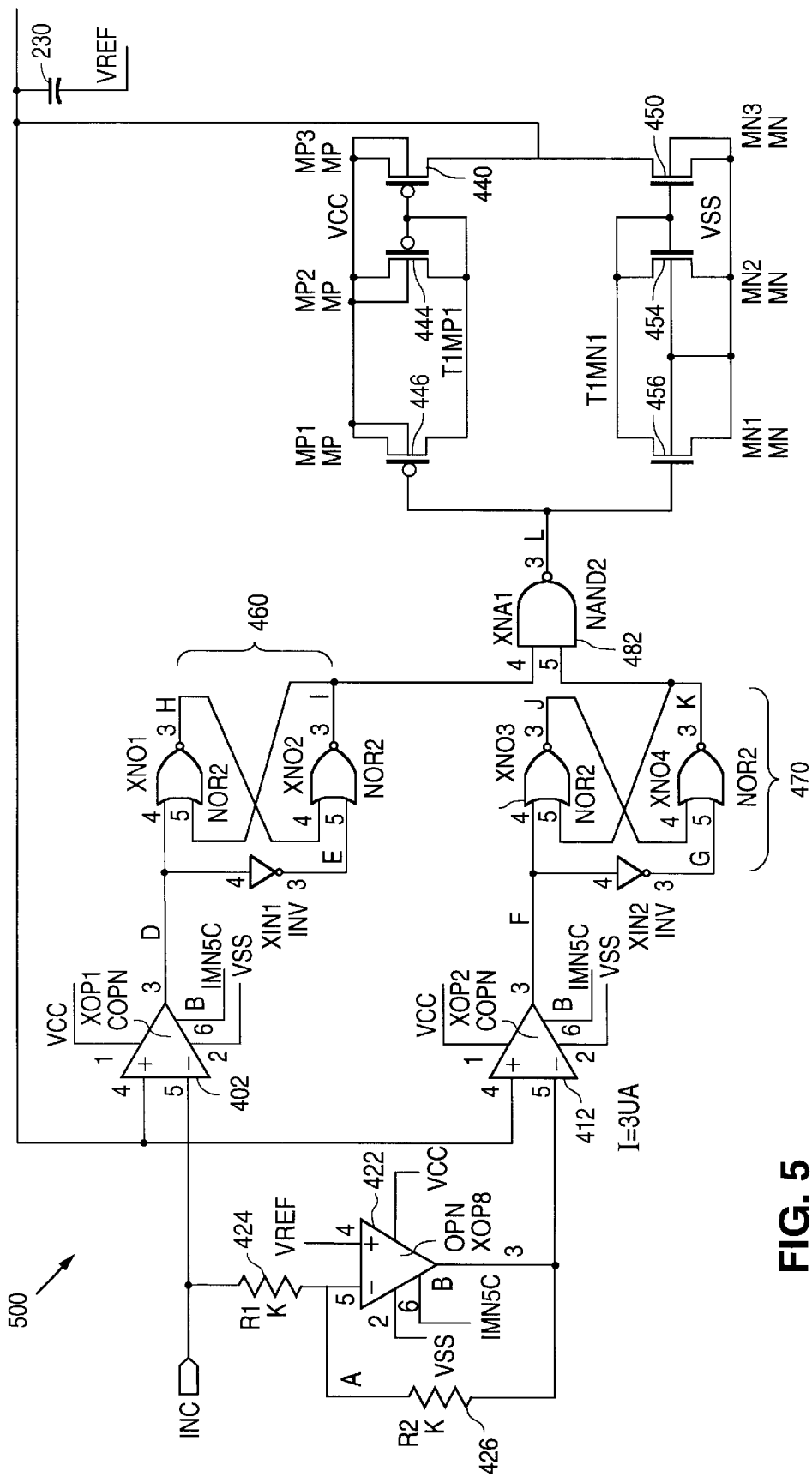
FIG. 5 is a circuit diagram of a preferred logical comparison circuit and charging and discharging switch configuration for low-voltage applications.

FIG. 5 is a preferred embodiment of a low-voltage circuit that implements the logical control function of the switched charging state rectifier 400 of FIG. 4. Two comparators 402, 412 and two data flip-flops 460, 470 are used to compare the magnitude of the input to the voltage on a capacitor 230 in the manner previously described in regards to FIG. 4. However, the complementary outputs of data flip-flops 460, 482 are input to a NAND gate 482. The output of NAND gate 482 is coupled to p-channel MOSFET charging switch 446 and n-channel discharging switch 456. Transistors 444 and 440 comprise a charging current source which is a first current-mirror. Transistors 454 and 450 comprise a discharging current source which is a second current mirror. Additional elements comprising a reference current source for the current mirror structure are shown as elements 1000, 1010 in FIG. 7.

The logical control function of the preferred embodiment of FIG. 5 has two modes of operation. Switch 446 turns on/off the first current mirror comprising transistors 440, 444 and those of element 1010. Switch 456 turns on/off the second current mirror comprising transistors 454, 450 and element 1000. As is well-known, a NAND gate 482 has a high output if either of its inputs have a logical value of zero. However, since NAND gate 482 is coupled to the complementary outputs of data flip-flops 460, 470, it will have a high output only when the magnitude of the input signal exceeds the voltage on capacitor 230. When the magnitude of the input signal is less than the voltage on capacitor 230, the output 365 of NAND gate 482 will be low. A low output 365 of NAND gate 482 has the effect that switch 446 is turned on and switch 456 is turned off. Conversely, a high output of NAND gate 482 turns on switch 456 and turns off switch 446.

In the preferred embodiment of FIG. 5, no discrete resistors are required to achieve attack/release times in excess of one millisecond. Capacitor 230 is preferably an integrated capacitor, although a discrete capacitor may also be used to achieve extremely long release times (e.g., greater than about ten milliseconds).

Figure 6:
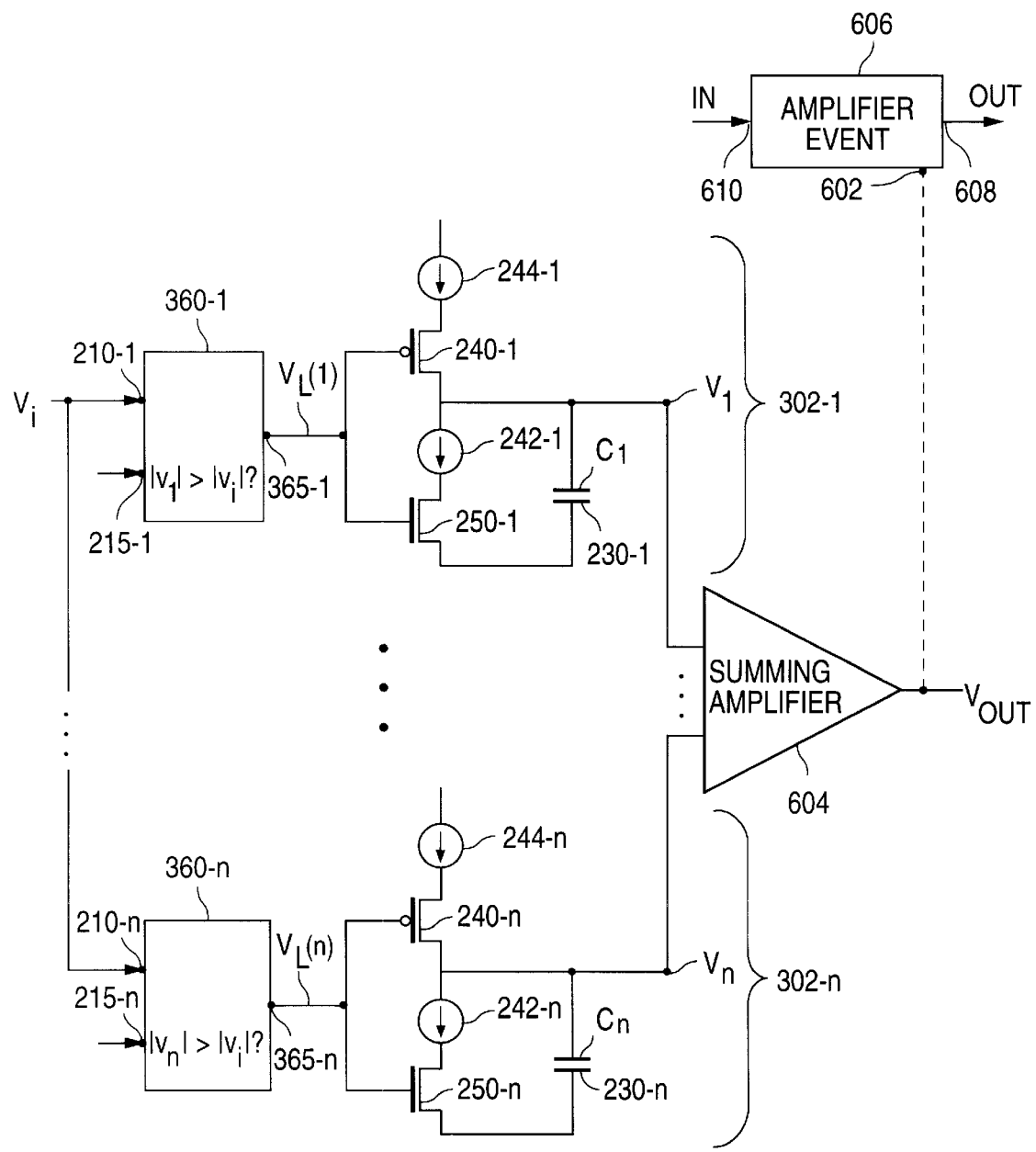
FIG. 6 is a block circuit diagram showing how the embodiment of FIG. 3 may be extended to produce a control signal which is the sum of the output of elements similar to those of FIG. 4 but with difference attack and release time constants.

The compactness of switched charging state rectifier 500 permits the outputs of a plurality of rectifiers 500 with different attack/release characteristics to be combined together in a summing amplifier 604, as shown in FIG. 6. Each switched charging state rectifier 302-i may have a different attack/release response. A simple way to implement this in an integrated circuit is to vary the capacitance of each capacitor 230-i. By summing the outputs of a plurality of switched charging state rectifiers 302-i, the attack/release characteristics may be further modified to achieve a controlled attack/release function.

Figure 7A:
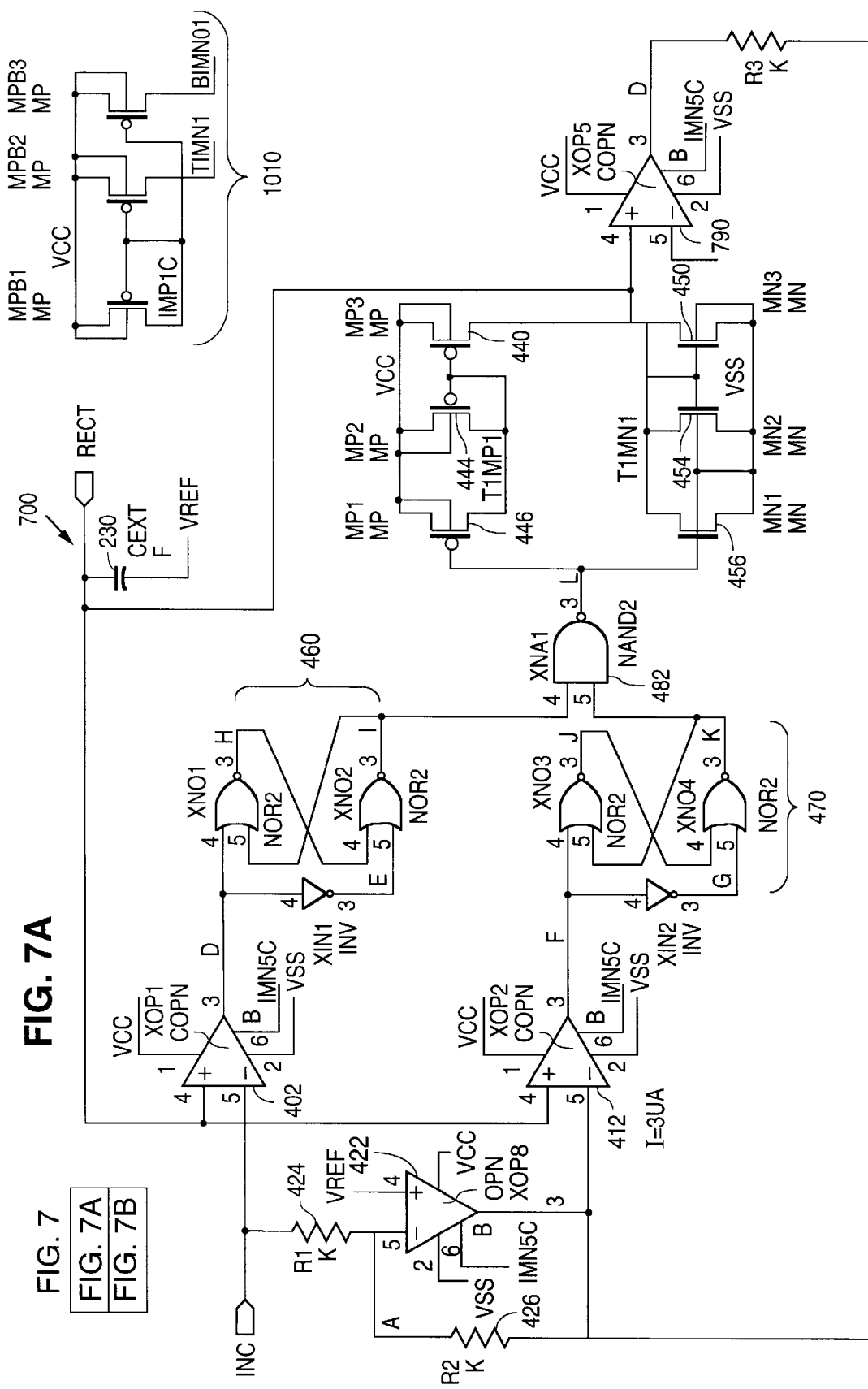
FIG. 7 is a circuit diagram of a preferred embodiment of the circuit of FIG. 6.
Figure 7B:
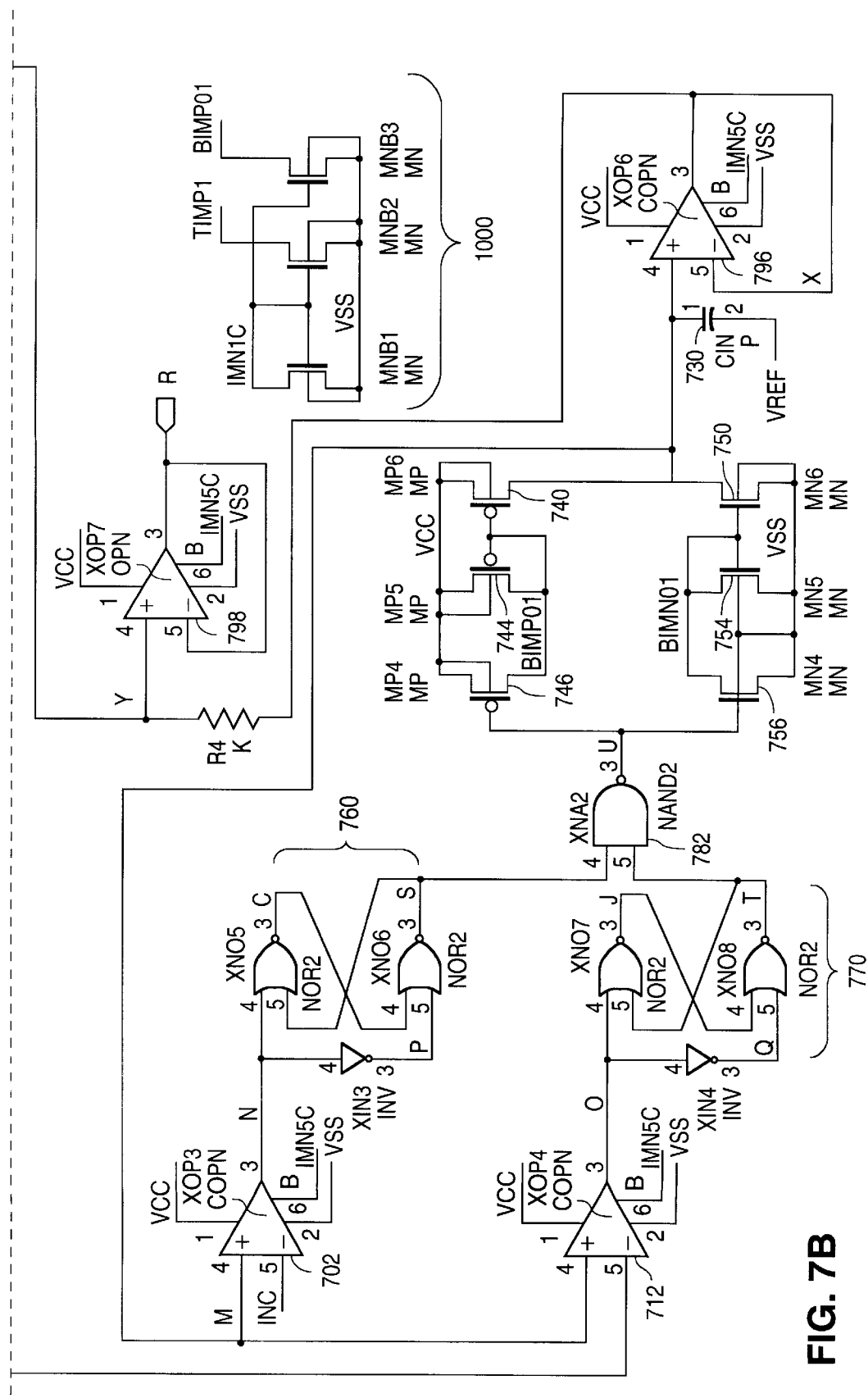

FIG. 7 is a circuit schematic of a preferred embodiment of a dual time-constant rectifier which sums the outputs of two control circuits 500 similar to those of FIG. 5. A first switched charging state rectifier comprises capacitor 230; comparators 402, 412; inverter 422; data-flip flops 460, 470; NAND gate 482; p-channel switches 446, 444, 442; and n-channel switches 456, 454, and 450. A second switched charging state rectifier comprises capacitor 730; comparators 702, 712; data flip-flops 760, 770; NAND gate 782; p-channel switches 746, 744, and 740; n-channel switches 756, 754, and 750; and capacitor 730. The second switched charging state rectifier is preferably identical to the first switched charging state rectifier with the exception that capacitor 230 has a different capacitance than capacitor 730. Capacitor 230 may, for example, have a value ten-to-one-hundred times larger than that of capacitor 730 by utilizing a discrete capacitor to implement capacitor 230. Op-amps 790, 796, and 798 are preferably arranged as a summing amplifier to combine the outputs of the two switched charging state rectifiers.

Figure 8:
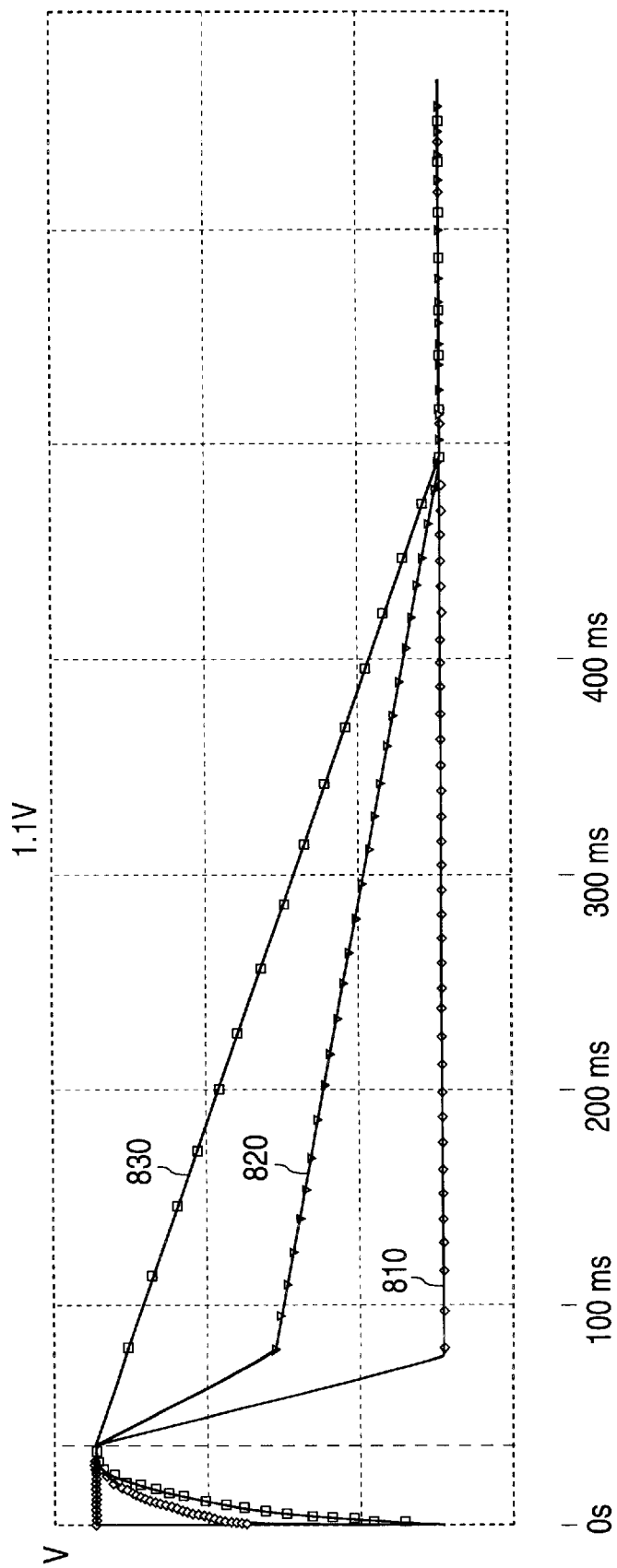
FIG. 8. is a plot of the output of the circuit of FIG. 7 in response to a 50 millisecond input pulse.

FIG. 8 shows a plot of the output voltage for an embodiment of FIG. 8 corresponding to capacitor 230 of first switched charging state rectifier having a capacitance value of 22 picofarads and capacitor 730 of second switched charging state rectifier having a capacitance of 2 microfarads. Curve 810 is a plot of the voltage on capacitor 730 whereas curve 820 is a plot of the voltage on capacitor 230 in response to an input voltage turning on at t=0 and lasting until t=50 milli-seconds. As can be seen in FIG. 8, each curve 810, 820 has attack and release times which are different from each other. Curve 830 shows the summed output of op-amp 798. As can be seen in FIG. 8, the use of summed outputs permits additional control over the attack/release function. Moreover, a variety of post fabrication techniques, such as enabling/disabling individual rectifiers 202; changing which capacitors 230, 730 the switched charging state rectifiers are coupled to (e.g., coupling both rectifiers to a common capacitor after fabrication); or enabling/disabling reference current sources for each current mirror may be used to adjust the attack/release response after the initial IC chip fabrication.

The ability to control the transient response of a switched charging state rectifier provides numerous benefits. One benefit is that it may produce a more pleasant compression function by eliminating the problem of pumping which occurs in conventional audio compressors. Another benefit is that the switched charging state rectifier is compact enough that the output of a plurality of switched charging state rectifiers may be combined together. Consequently, the transient response may be adjusting by changing internal/external connections to one or more of the switched charging state rectifiers to adjust the transient response of an individual switched charging state rectifier as required to alter the combined response. Thus, the present invention permits the transient rise (attack) and transient decay (release) response to be selected to approximate a variety of functions, such as linear, piece-wise linear, etc.

It will be understood that the compression function of the switched charging state rectifiers may be emulated by other circuits performing a similar function the charging/ discharging of a capacitor in a switched charging state rectifier. Referring again to FIG. 8, it will be understood that the selectable attack/release function may be implemented with circuits or systems which are mathematically equivalent one or more switched charging state rectifiers. In particular, a digital signal processor may be programmed to perform a mathematically equivalent function, i.e., produce a rectified output with a controlled attack or release response, linear attack or release functions, piecewise-linear attack or release response, etc.

The switched charging state rectifier of the present invention is operable at a power supply voltage of less than 1.5 volts and can detect extremely small changes in the magnitude of an input signal. Experiments by the inventors indicate that the switched charging state rectifier of the present invention is capable of distinguishing voltage changes as low as 250 micro-volts (0.25 millivolts). One limitation on the ability of the switched charging state rectifier to accurately measure small voltage changes is the inherent limitation of the op-amps used in the preferred embodiment. Since op-amps can distinguish voltage difference of several millivolts, it is believed that the switched charging state rectifier of the present invention may ultimately be capable of detecting and measuring voltage changes at least as low as 10 micro-volts.

In summary, the switched charging state rectifier of the present invention alternately switches on and off charging and discharging currents to a capacitor as a function of the magnitude of an input signal. When the magnitude of the input signal is less than the capacitor voltage, the capacitor is charged by a charging current. When the magnitude of the input signal is less than the capacitor voltage, the capacitor is discharged by a discharging current. The charging current may be limited by a constant current source, such as that of a current mirror. Alternately, the charging current may also be limited by a non-constant current source. Similarly, the discharging current may be limited by either a constant current source or a non-constant current source. The voltage on the capacitor will have a characteristic attack/release function determined by the manner in which the charging/ discharging currents are limited. In a preferred embodiment, the output of a plurality of switched charging state rectifiers is combined in a summing amplifier to provide additional control over the transient voltage response.

Although a preferred embodiment of the present invention and modifications thereof have been described in detail herein, it is to be understood that this invention is not limited to those precise embodiments and modifications, and that other modifications and variations may be affected by one of ordinary skill in the art without departing from the spirit and scope of the invention as defined in the appended claims.

What is claimed is:

1. A rectifier producing an output signal that is a function of the magnitude of an input signal with a controlled transient response, comprising:
   a capacitor;
   a charging current element coupled to said capacitor having a charging switch to regulate the flow of a charging current into said capacitor;
   a discharge current element coupled to said capacitor having a discharge switch to regulate the flow of a discharging current out of said capacitor and including a current mirror having a diode-connected MOSFET, a MOSFET coupled to said diode-connected MOSFET to have a mirror current proportional to the source-drain current of said diode-connected MOSFET, and a control MOSFET to switch on and off the source-drain current in said diode-connected MOSFET;
   a switch controller which generates control signals for alternately turning on said charging switch and said discharge switch, said switch controller having an input signal terminal and an input corresponding to the voltage on said capacitor; and
   wherein said switch controller controls said switches so that a charging current increases the charge on said capacitor when the magnitude of the input signal is greater than the capacitor voltage and a discharge current decreases the charge on said capacitor when the magnitude of the input signal is less than the capacitor voltage.

2. The rectifier of claim 1, wherein said discharge current element includes a current limiting element.

3. The rectifier of claim 2, wherein said charging current element includes a current limiting element.

4. The rectifier of claim 1, wherein said charging current element comprises a current source and said discharging current element comprises a current sink.

5. The rectifier of claim 1, wherein said charging current element comprises a second current mirror.

6. The rectifier of claim 1, wherein said charging current element comprises a second current mirror having a second diode-connected MOSFET, a second MOSFET coupled to said diode-connected MOSFET to have a mirror current proportional to the source-drain current of said diode-connected MOSFET, and a second control MOSFET to switch on and off the source-drain current in said diode-connected MOSFET.

7. The rectifier of claim 1, further comprising:
   a second capacitor;
   a second charging current element coupled to said second capacitor and having a second charging switch to regulate the flow of a second charging current into said second capacitor;
   a second discharge current element coupled to said second capacitor and having a second discharge switch to regulate the flow of a second discharging current out of said second capacitor;
   a second switch controller which generates control signals for alternately turning on said second charging switch and said second discharge switch, said second switch controller having a signal input and an input corresponding to the voltage on said second capacitor;
   wherein said second switch controller controls said second switches so that a charging current increases the charge on said second capacitor when the magnitude of the input signal is greater than the voltage on said second capacitor and a discharge current decreases the charge on said second capacitor when the magnitude of the input signal is less than the voltage on said second capacitor.

8. The rectifier of claim 7, further comprising:
   a summing amplifier to sum the output of said first capacitor and said second capacitor.

9. A rectifier producing an output signal that is a function of the magnitude of an input signal with a controlled transient response, comprising:
   a capacitor;
   a charging current element coupled to said capacitor having a charging switch to regulate the flow of a charging current into said capacitor;

a discharge current element coupled to said capacitor having a discharge switch to regulate the flow of a discharging current out of said capacitor;

a switch controller which generates control signals for alternately turning on said charging switch and said discharge switch, said switch controller having an input signal terminal and an input corresponding to the voltage on said capacitor said switch controller including:

a first comparator with a non inverting terminal coupled to said capacitor and its inverting terminal coupled to said input signal terminal;

a first data flip-flop coupled to the output of said comparator;

a voltage inverter;

a second comparator with its non-inverting terminal coupled to said capacitor and its inverting terminal coupled to said input voltage terminal via said voltage inverter;

a second data flip-flop coupled to the output of said comparator; and a logic gate connected to the outputs of said flip-flops to produce a logical output indicating whether the magnitude of the input voltage is greater than the voltage on said capacitor; and wherein said switch controller controls said switches so that a charging current increases the charge on said capacitor when the magnitude of the input signal is greater than the capacitor voltage and a discharge current decreases the charge on said capacitor when the magnitude of the input signal is less than the capacitor voltage.

10. A method of producing a rectified voltage of a signal with controlled attack and release response for an audio compressor, comprising the steps of:

(a) providing a first rectification element, said first rectification element having a first output proportional to the magnitude of the input signal with a first preselected attack and release function;

(b) providing a second rectification element, said second rectification element having a second output with a second preselected attack and release function, said first and second rectification element being emulated by a digital signal processor; and (c) summing said first and said second output.

11. The method of claim 10, wherein said first and said second preselected attack and release functions comprise linear rise and decay characteristics.

12. A method of compressing an audio signal comprising the steps of:

(a) detecting an input signal;

(b) generating a first rectified signal which is a first function of the magnitude of said input signal and having a first preselected attack and release function;

(c) generating a second rectified signal which is a second function of the magnitude of said input signal and having a second preselected attack and release function; and (d) summing said first and said second rectified signals for generating a combined signal having a third attack and release function.

13. The method of claim 12, wherein said first and said second preselected attack and release functions have a linear rise and decay response.

14. The method of claim 12, wherein a digital signal processor is used to generate said first and said second rectified signals.

15. The method of claim 12 where the first and second attack and release functions are generated by current sources.

16. The method of claim 12 where the first and second attack and release functions are generated by switched resistors.

17. The method of claim 12 where the first and second attack and release functions are generated by a combination of current sources and switched resistors.

18. The method of claim 12 where said generating steps include the use of a charging switch and a discharge switch including the steps of said switches switching either current sources or fixed resistors.

* * * * *